United States Patent
Dobuzinsky et al.

(10) Patent No.: US 6,518,151 B1
(45) Date of Patent: Feb. 11, 2003

(54) DUAL LAYER HARD MASK FOR EDRAM GATE ETCH PROCESS

(75) Inventors: David Mark Dobuzinsky, New Windsor, NY (US); Babar Ali Khan, Ossining, NY (US); Joyce C. Liu, Hopewell Junction, NY (US); Paul R. Wensley, Poughquag, NY (US); Chienfan Yu, Highland Mills, NY (US)

(73) Assignees: International Business Machines Corporation, Armonk, NY (US); Infineon Technologies AG, Munich (DE)

(*) Notice: Subject to any disclaimer, the term of this patent is extended or adjusted under 35 U.S.C. 154(b) by 0 days.

(21) Appl. No.: 09/924,118

(22) Filed: Aug. 7, 2001

(51) Int. Cl.[7] .......................... H01L 21/22; H01L 21/38
(52) U.S. Cl. ....................................... 438/551; 438/258
(58) Field of Search ................................. 438/238, 241, 438/253, 258, 261, 287, 396, 551, 954, 637, 592

(56) References Cited

U.S. PATENT DOCUMENTS

| | | | |
|---|---|---|---|
| 5,886,410 A | * | 3/1999 | Chiang et al. |
| 6,037,222 A | | 3/2000 | Huang |
| 6,069,037 A | | 5/2000 | Liao |
| 6,117,730 A | * | 9/2000 | Komori et al. |
| 6,153,459 A | * | 11/2000 | Sun |

* cited by examiner

*Primary Examiner*—David Nelms
*Assistant Examiner*—Phuc T. Dang
(74) *Attorney, Agent, or Firm*—Ira D. Blecker; McGinn & Gibb, PLLC (57) ABSTRACT

A method of fabricating an integrated circuit chip having a first region of a first layout rule and a second region of a second layout rule. The method includes using a first material to establish a first hard mask pattern in only the first region and using a second material to establish a second hard mask pattern on top of the first hard mask pattern. The second material is additionally used to establish a third hard mask pattern in the second region.

17 Claims, 12 Drawing Sheets

DUAL LAYER HARD MASK FOR EDRAM GATE ETCH PROCESS

BACKGROUND OF THE INVENTION

1. Field of the Invention

This invention relates generally to the fabrication of integrated circuit devices. The invention particularly relates to integrating, on a single chip of "embedded Dynamic Access Memory" (eDRAM) products, self-aligned, borderless contacts in DRAM arrays in a first region and bordered contacts in a logic support area in a second region, using a single poly-Si patterning process (lithography and etch) and a single contact definition process. The invention addresses the problem of fabrication of an integrated circuit chip having two different layout rules on the same chip. In this case, a highly packed layout is used for the gate contacts of the DRAM array region in contrast to a more separated layout for gate contacts in the region containing support logic circuits. Components are concurrently fabricated in both areas, overcoming prior art techniques of having to deal separately with the respective region devices.

2. Description of the Related Art

In a prior filing application Ser. No. 09/765,036, filed on Jan. 17, 2001), a method was described of using two separate critical DUV photoresist masks to form the dual gates sequentially with a blocking non-critical MUV photoresist mask for separation. However, this method has a higher manufacturing cost due to the use of two DUV masks. In another prior art re-oxidized polysilicon gate inside the contact holes provides the isolation instead of using thick cap nitride layer. The drawback of this scheme is that it has very narrow process windows and is difficult for manufacturing.

In the closed packed DRAM array, there is no room for contact borders, so the borderless contacts are preferred which in turn requires the use of a thick nitride cap layer to protect the polysilicon gate when the contact via etch is being made in between the closely packed gate lines. On the other hand, the logic area has no such requirement and the need for a silicidation process precludes the use of thick cap nitride layer. This invention aims to provide a novel scheme to create such a structure having two distinctive layout requirements.

SUMMARY OF THE INVENTION

It is, therefore, an object of the present invention to provide a method for generating self-aligned, borderless contacts in DRAM arrays and bordered contacts in a logic support area on eDRAM products using a single contact definition process (lithography and etch).

It is an additional object of the invention to provide a fabrication method for a chip containing regions having different design rule requirements.

It is an additional object to provide a method that is simpler, less costly, and relaxes the litho overlay requirement for the MOL (middle of the line) process.

To achieve the above objects and goals, according to a first aspect of the invention, described herein is a method of fabricating an integrated circuit chip having a first region of a first layout rule and a second region of a second layout rule, including: using a first material to establish a first hard mask pattern in only the first region; and, using a second material to establish a second hard mask pattern on top of the first hard mask pattern, the second material further establishing a third hard mask pattern in the second region.

According to a second aspect of the invention, described herein is a method of fabricating eDRAM on an integrated circuit chip, including: using a first material to establish a first hard mask pattern only in a first region to contain a DRAM array; and, using a second material to establish a second hard mask pattern on top of the first hard mask pattern, the second material further establishing a third hard mask pattern in a second region.

According to a third aspect of the invention, described herein is a method of fabricating eDRAM on an integrated circuit chip, including: initially depositing an oxide layer over the top surface of the chip, using a first material to establish a first hard mask pattern only in a first region of the chip, where the first region is preselected to include a DRAM array; using a second material to establish a second hard mask pattern on top of the first hard mask pattern, where the second material further establishes a third hard mask pattern in a second region of the chip, where the second region is preselected to contain control logic; using an etch process to form gate stacks simultaneously in the first region and the second region; and, forming simultaneously borderless contact studs in the first region and bordered contact studs in the second region.

According to a fourth aspect of the invention, described herein is a method of fabricating eDRAM on an integrated circuit chip, including: using a first material to establish a first hard mask pattern only in a first region of the chip, where the first region is preselected to include a DRAM array; using a second material to establish a second hard mask pattern on top of the first hard mask pattern, where the second material additionally is used to establish a third hard mask pattern in a second region of the chip, where the second region is preselected to include control logic; and forming simultaneously borderless contact studs in the first region and bordered contact studs in the second region.

According to a fifth aspect of the invention, described herein is a method of fabricating an integrated circuit chip having a first region having a first set of devices with a first layout rule and a second region having a second set of devices with a second layout rule, the method including: forming a dual hard mask in the first region; and, simultaneously forming the first set of devices and the second set of devices.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
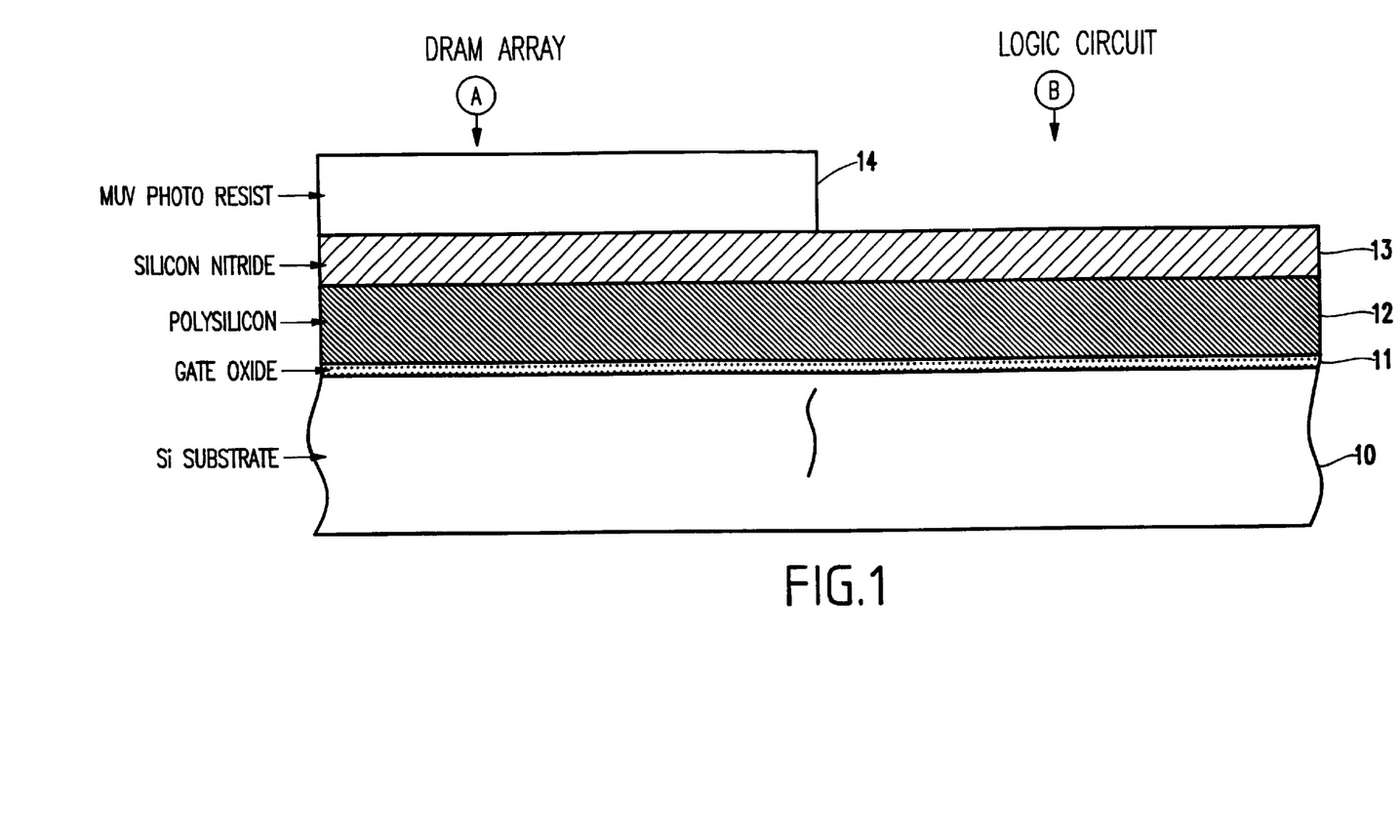
FIGS. 1–11 show the process steps of the invention.

This invention generates self-aligned, borderless contacts in DRAM arrays and bordered contacts in logic support area on eDRAM products using a single contact definition process (lithography and etch). Referring now to the drawings, and more particularly to FIG. 1, this figure shows a simplified cross section of a wafer intended to have an eDRAM array in region A and support logic circuitry in region B. The wafer includes substrate 10 which has been covered by a gate oxide layer 11 and a polysilicon layer 12.

Gate oxide layer 11 and polysilicon layer 12 interplay with the invention since a key aspect of the method is that of allowing regions on the same chip having two different layout styles, where both regions have devices using the oxide layer for transistor gate insulators and the polysilicon layer as gate contacts. This effect is achieved by introducing a thick nitride etch stop layer 13 (approximately 100 nm) which will remain only in the array area A at the hardmask stage, meaning here on top of the polysilicon (poly-Si) layer 12. The exact thickness of this nitride layer is not critical and the range of thickness depends upon the characteristics of the etch used in the gate etch step. The nitride thickness is predetermined by considering the selectivity of the gate etchant to nitride and the specific geometry of the gates (see FIG. 11 for contact hole etch step, wherein the etch for the borderless contact hole 1101 possibly overlaps the gate stack and thereby results in etching away some the silicon nitride barrier for that gate stack). Etchants that etch away both the poly-Si layer 12 as well as nitride would require a thicker initial nitride layer 13. Silicon nitride layer 13 would typically be formed using a LPCVD process.

Figure 2:
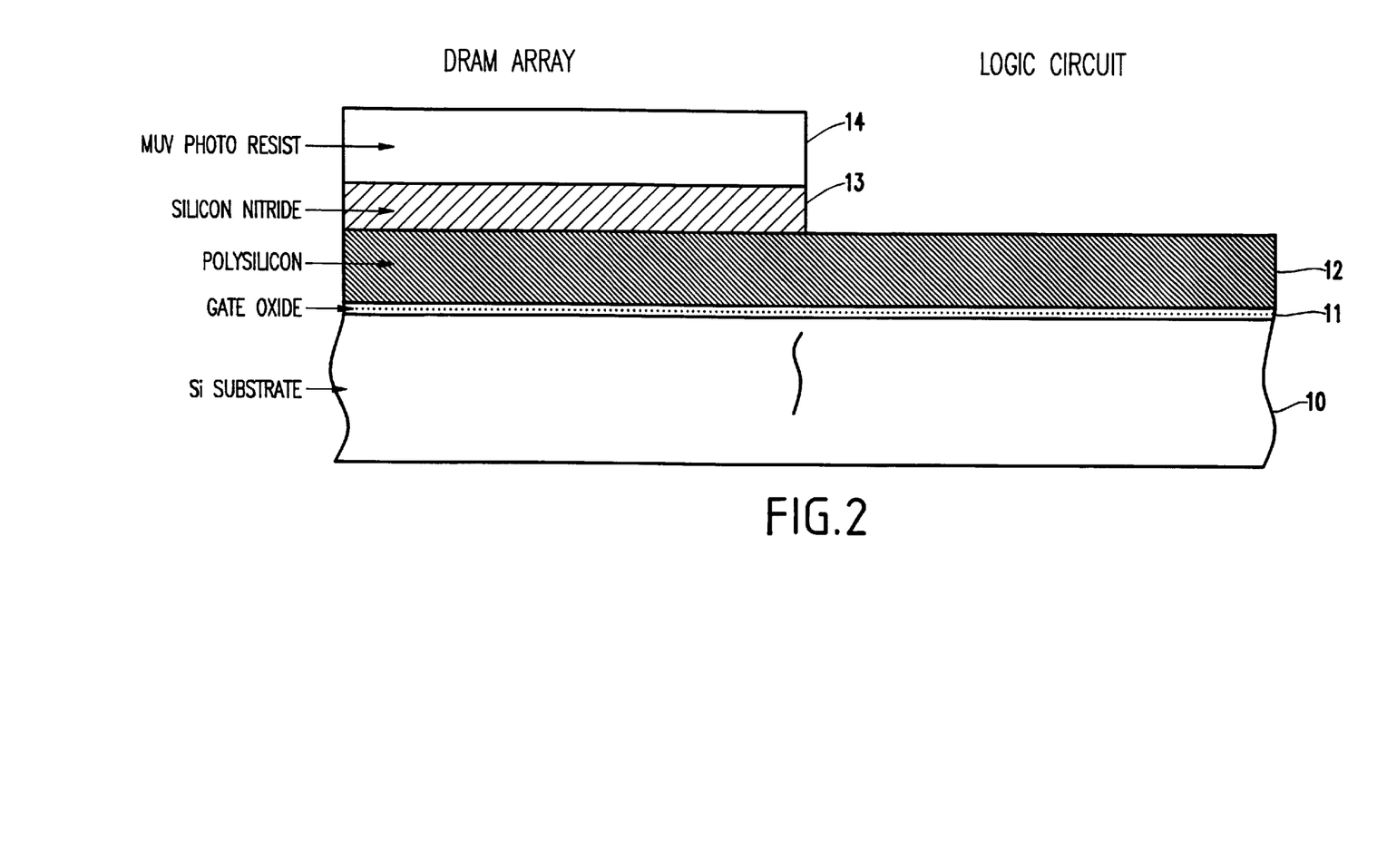
Figure 3:
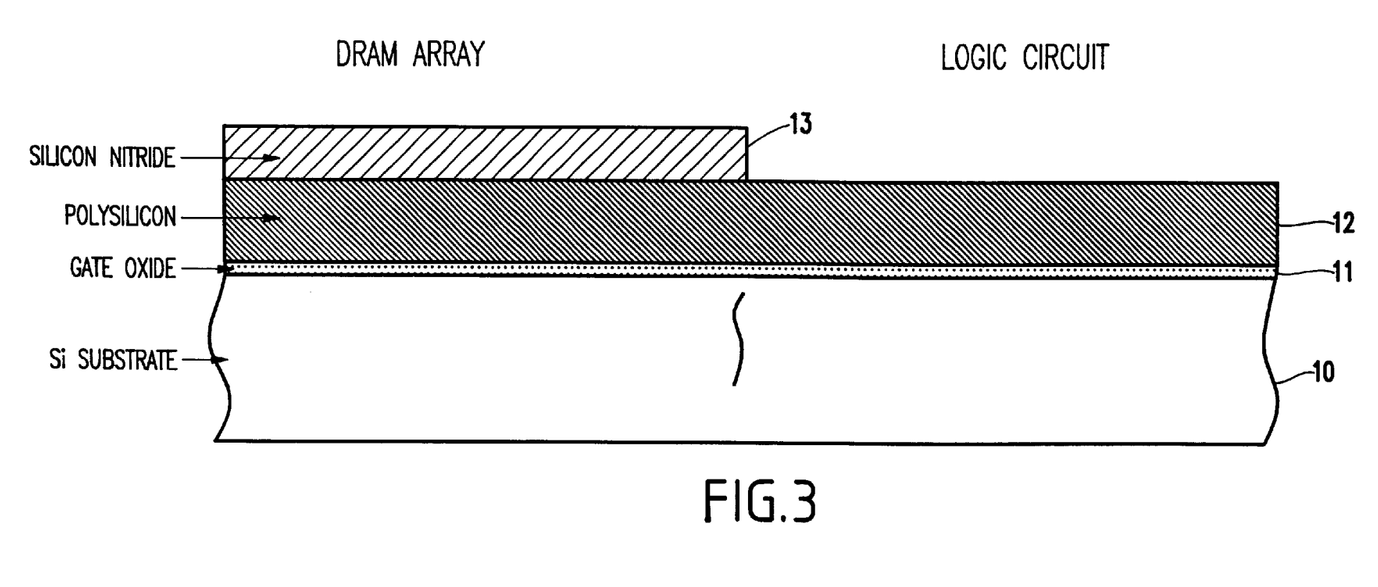
Figure 4:
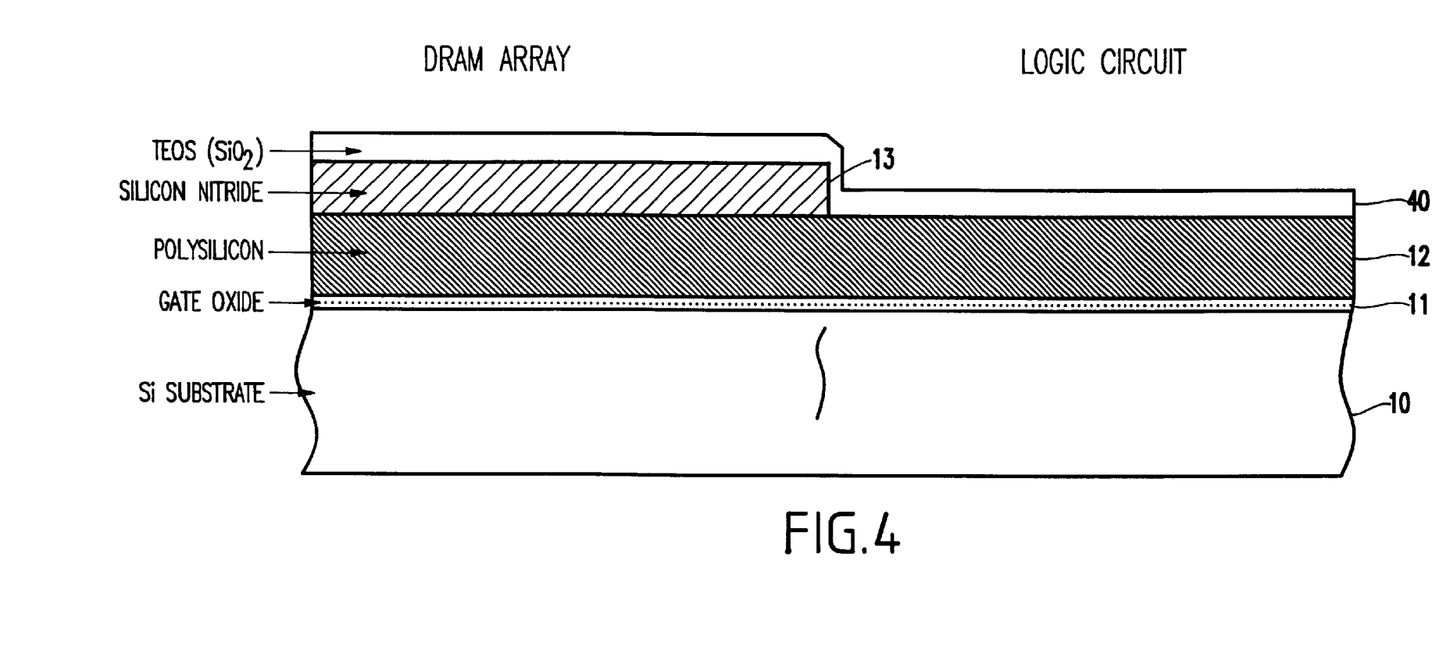

The nitride layer 13 is first deposited over the entire wafer and then selectively etched in all areas except the array area A by using a standard (blocking) etch mask layer 14, followed by the etching of nitride in areas not covered by the resist mask 14 (FIG. 2). That is to say, since the nitride layer is important only in the region A having the DRAM array, it is removed from the region B having the support logic circuits, using relatively inexpensive Middle Ultra Violet (MUV) photoresist to block the etching of the silicon nitride layer in region A. An MUV (Middle Ultra Violet) blocking level mask 14 is deposited using standard photolithographic techniques. The nitride is then removed from logic circuit region B using a selective silicon nitride etch. Next, the remaining MUV resist 14 is stripped (see FIG. 3) and a thin TEOS layer 40 is deposited (see FIG. 4) over the entire wafer.

In order to get the higher definition of the tightly packed features required in the DRAM array region, a more expensive Deep Ultra Violet (DUV) masked etch having a shorter wavelength of 193 nm will be used for the hardmask open step to follow. Therefore, a DUV mask will be used for gate patterns in both the DRAM array region A and logic region B, using standard lithographic techniques. The litho focus window is found to be large enough in the array area. It should be noted that the step caused by the silicon nitride 14 remaining in the DRAM region potentially causes a focus problem for the subsequent photolithographic steps. However, the litho focus window has been found to be large enough in the array area, meaning that the step-height difference between the logic area and the DRAM area does not cause a focus problem.

Figure 5:
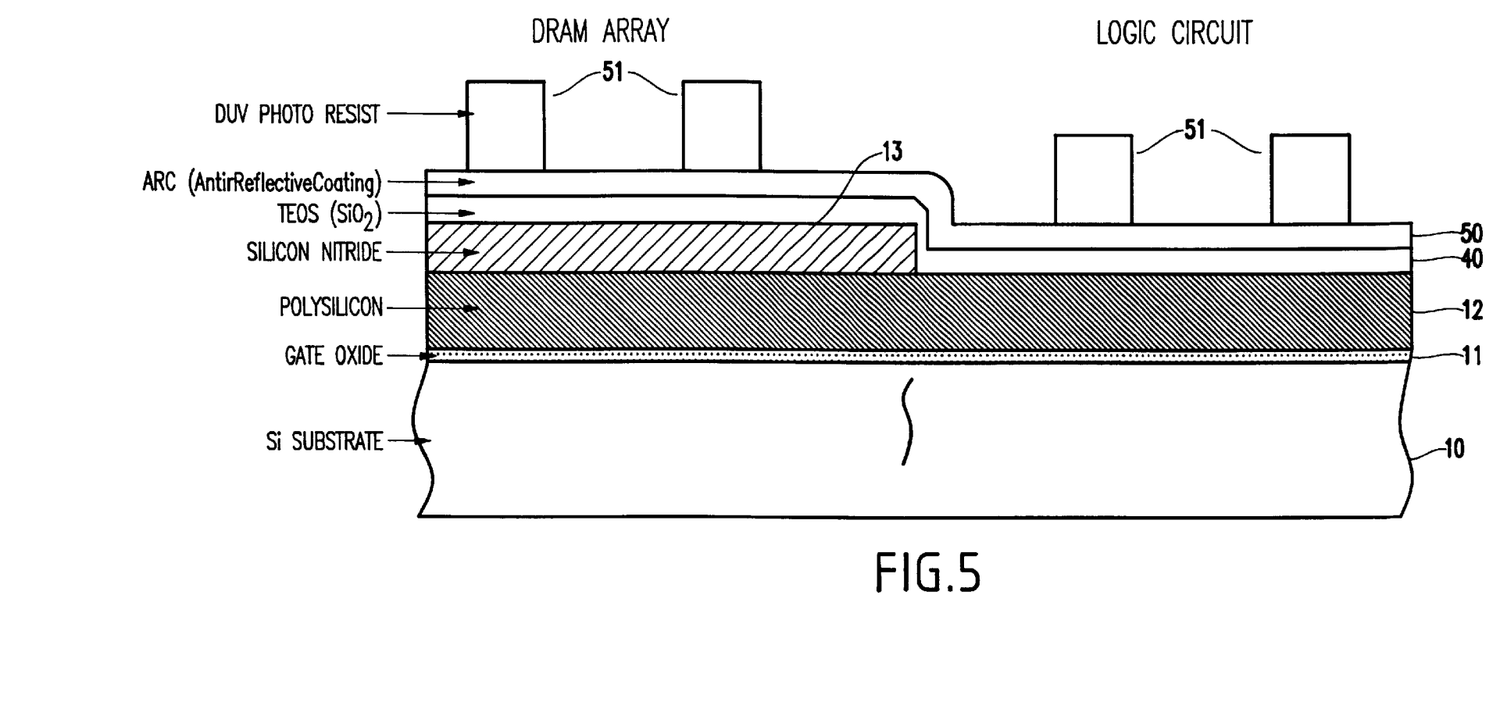

To achieve the etch that will define the gate contacts, an ARC (Anti-Reflective Coating) layer 50 for reducing surface interference in the subsequent photolithographic steps is first deposited on top of TEOS layer 40, followed by deposition of a DUV Photo Resist layer. This DUV Photo Resist layer is then developed using a standard photolithographic process. FIG. 5 shows the result of this photolithographic development and subsequent etch to leave the DUV photoresist pattern 51. This pattern define the areas to become the gate contacts.

Figure 6:
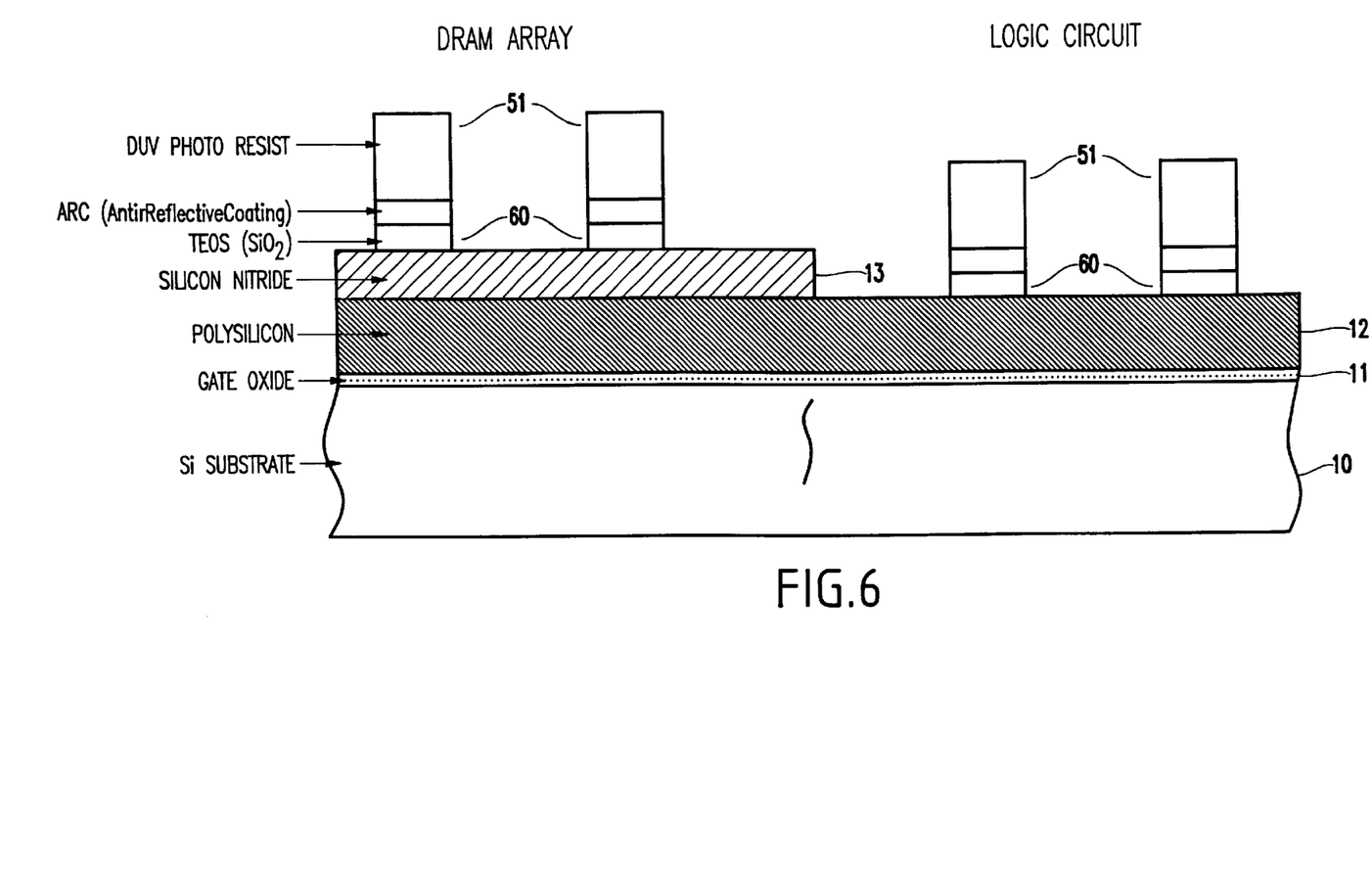
Figure 7:
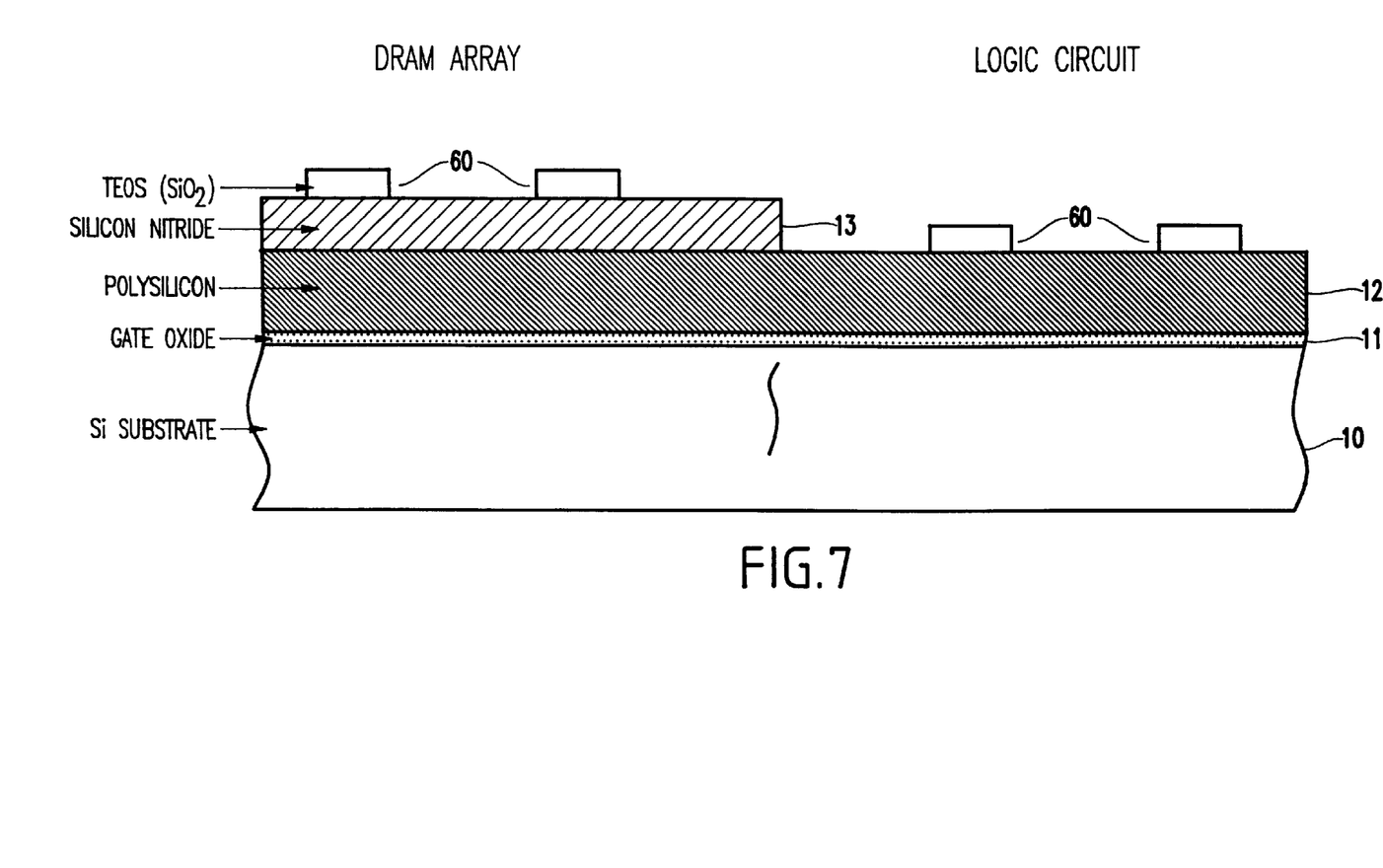
Figure 8:
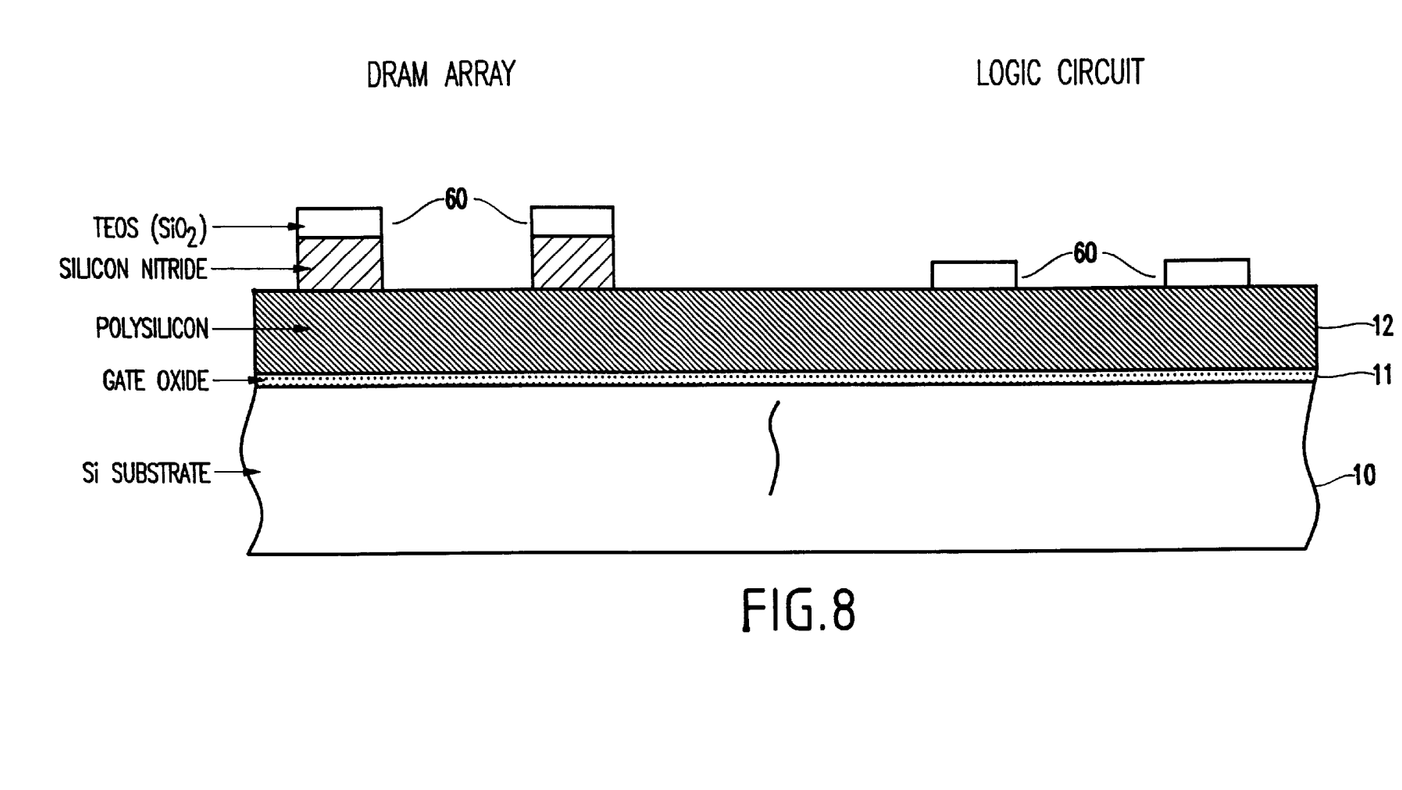

FIG. 6 shows that TEOS caps 60 are formed by the DUV masked etch. These TEOS caps 60 will become the TEOS hard mask stop once the DUV photoresist and ARC layers remnants are stripped (see FIG. 7). The etch step result of FIG. 8 shows that the pattern has been transferred to the silicon nitride layer, which allows the underlying polysilicon layer 12 to be etched to form the gate stacks 90 shown in FIG. 9. FIG. 8 shows the selectively etching off the nitride cap 13 on top of the poly-Si in array region A, using a silicon nitride etch of high selectivity to both oxide and poly so the etch of TEOS and poly-Si is minimized. The etch here needs to minimize the loss of cap TEOS in both the logic and DRAM areas and exposed silicon in the logic area so the gate etch in FIG. 9 can have a more uniformed poly-silicon layer and adequate TEOS cap layer as a mask.

Figure 9:
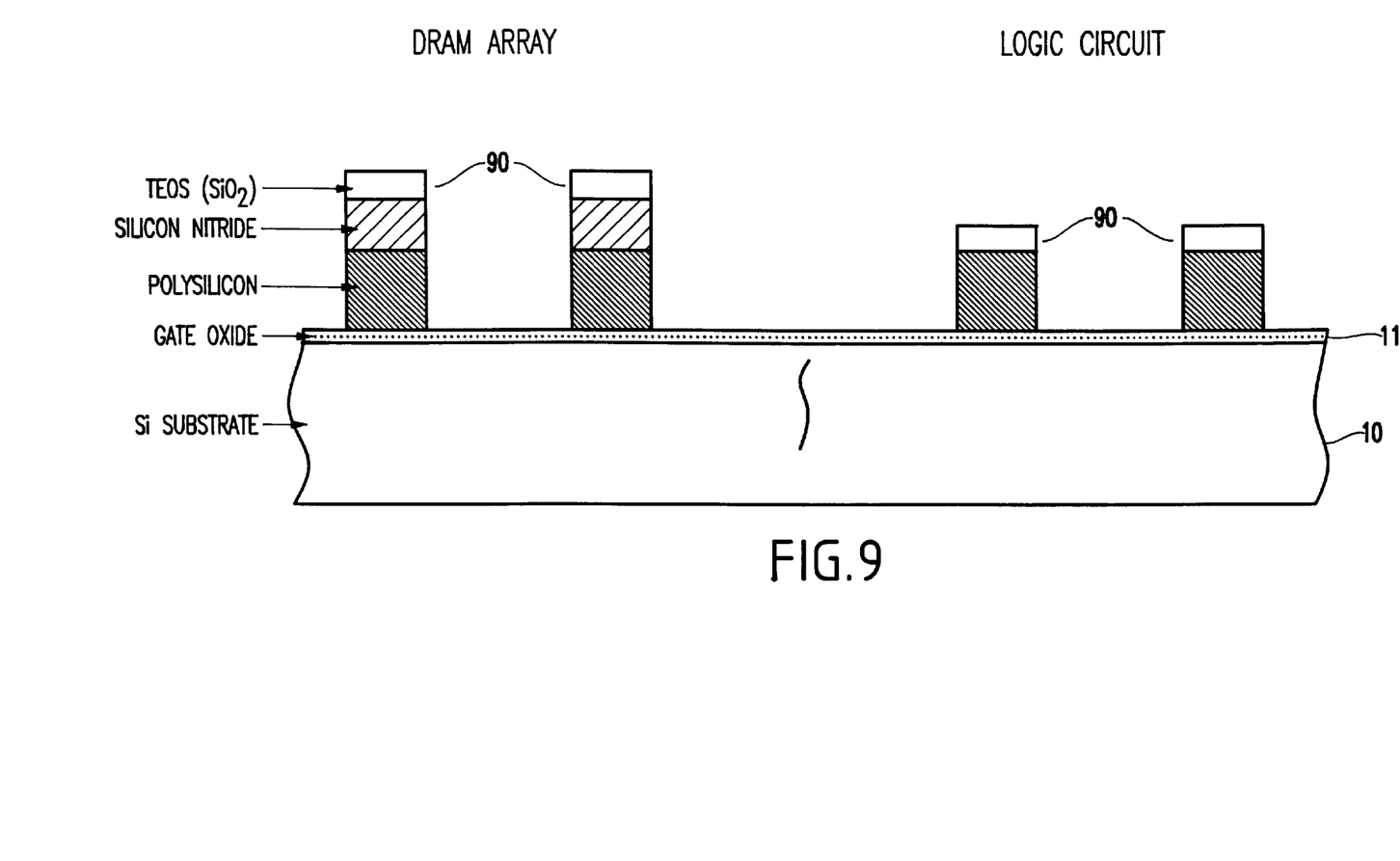

The structure shown in FIG. 9 following the gate stack 90 etching away unprotected polysilicon 12 provides pre-doped poly-Si gates with a dual-layer hard mask (thin TEOS combined with thick nitride) in the array area A and as poly-Si gates with a thin TEOS (tetraethoxysilane) hard mask in the logic support area B. A highly selective nitride to oxide and nitride to poly-Si etch process for mask etching results in this simple integration scheme.

One of the key advantages of this invention is that the gate stacks are simultaneously formed in both the higher density DRAM region and the logic circuit region. The remaining steps merely continue to form the device simultaneously in both regions.

Figure 10:
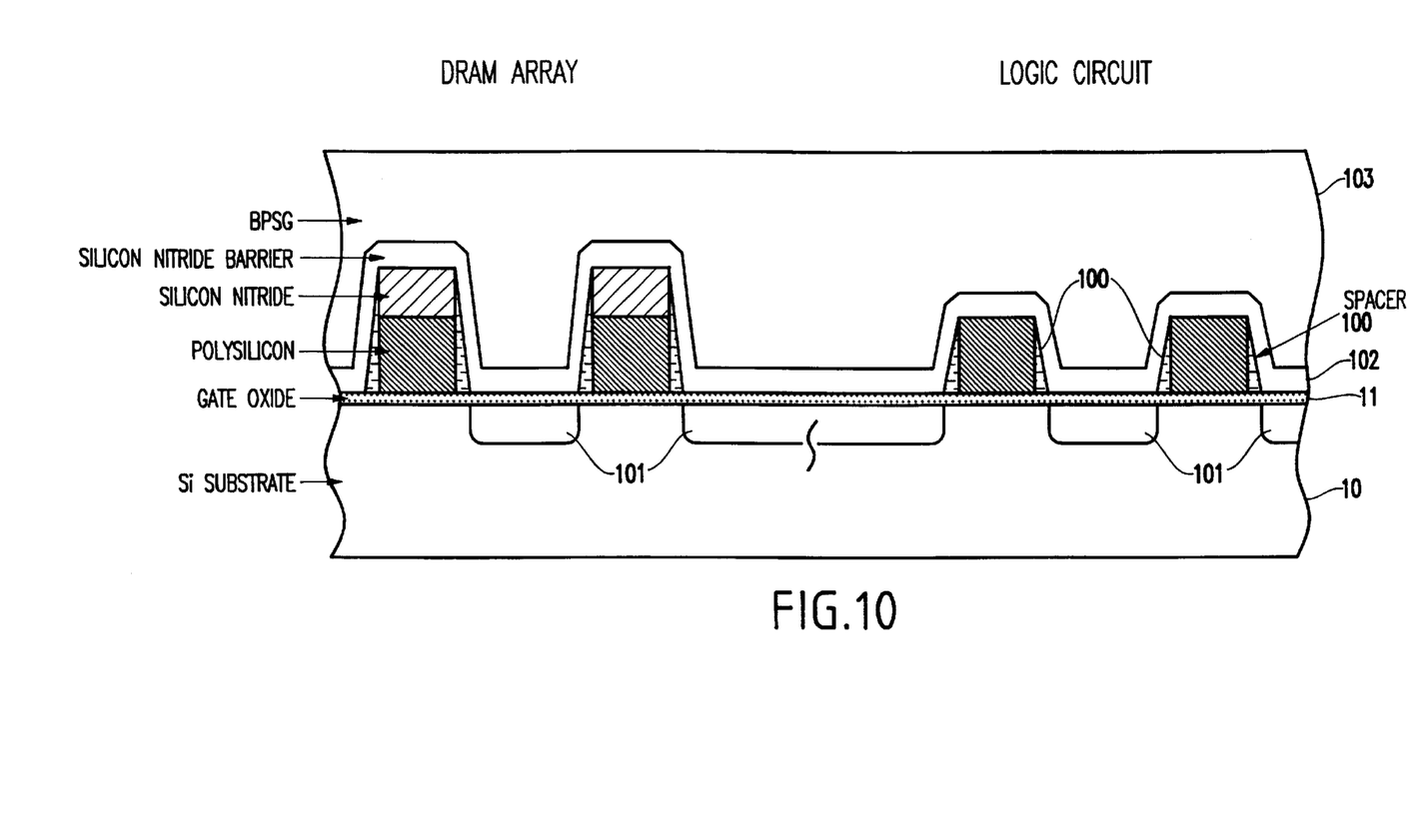

FIG. 10 shows an intermediate step in this construction process. The TEOS caps 90 (see FIG. 9) have been stripped and spacers 100 formed of silicon nitride have been formed around the gate contacts. Spacer formation uses the known technique of depositing and selectively etching a layer of silicon nitride. Transistor source/drain diffusion regions 101 are then established, using the gate stack/spacer structures as self-alignment masks for a standard ion implantation process. Silicon nitride barrier layer 102 is then deposited, followed by deposition of BPSG layer 103, which serves as a fill-in and leveling layer.

Figure 11:
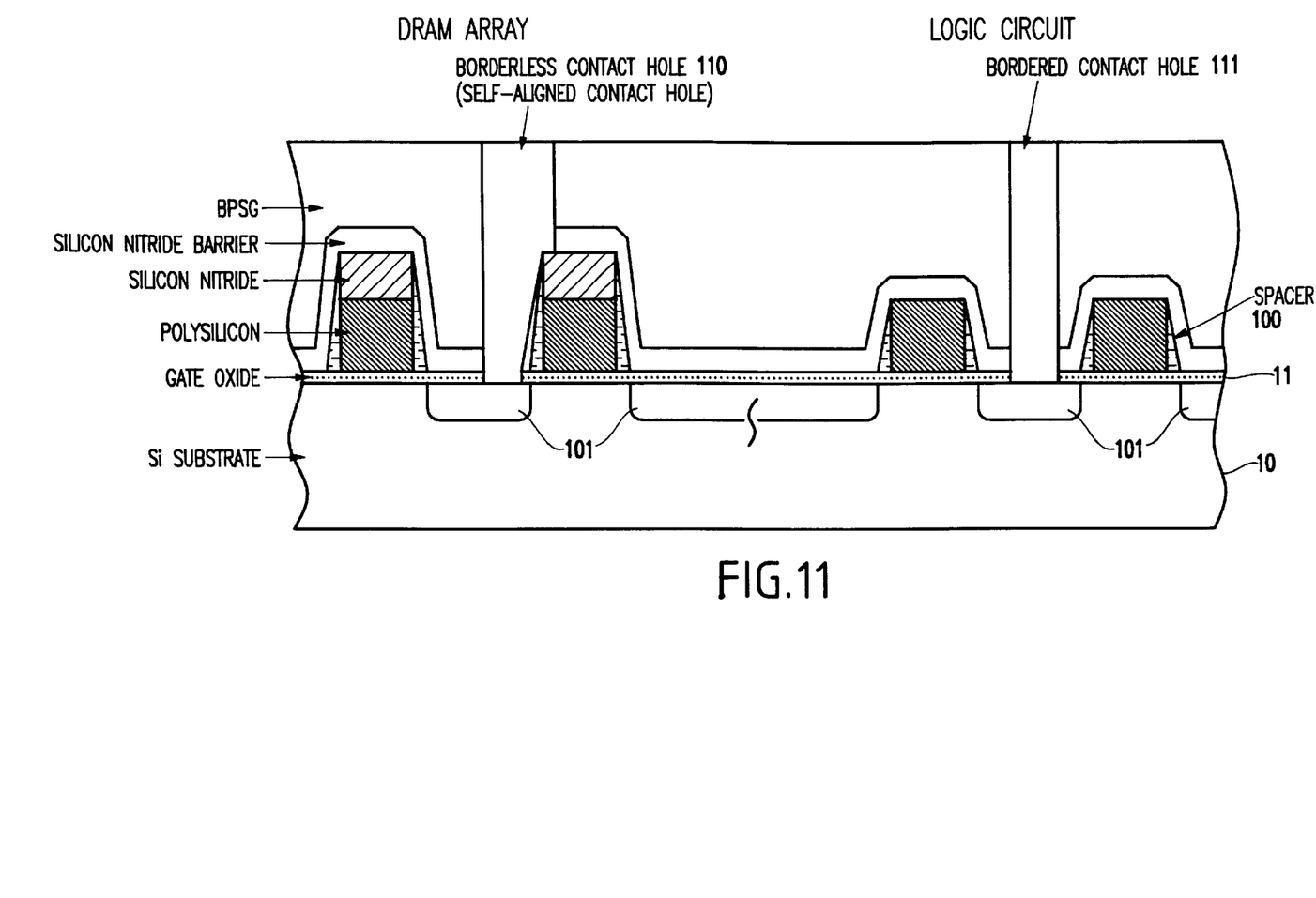

FIG. 11 shows one possible etching technique to form the final contacts with preselected source/drain regions. Standard photolithographic techniques are used to define regions to be etched through the BPSG layer for borderless contact holes 110 in the DRAM region and for bordered contact holes 111 in the logic circuit region. Although FIG. 1 shows the BPSG layer etch as involving the entire layer, an alternative would be removal of the top portion of this layer by CMP until the top of the silicon nitride barrier layer of the gate stacks are exposed and then etching the contact holes down to the diffusion regions 101.

Figure 12:
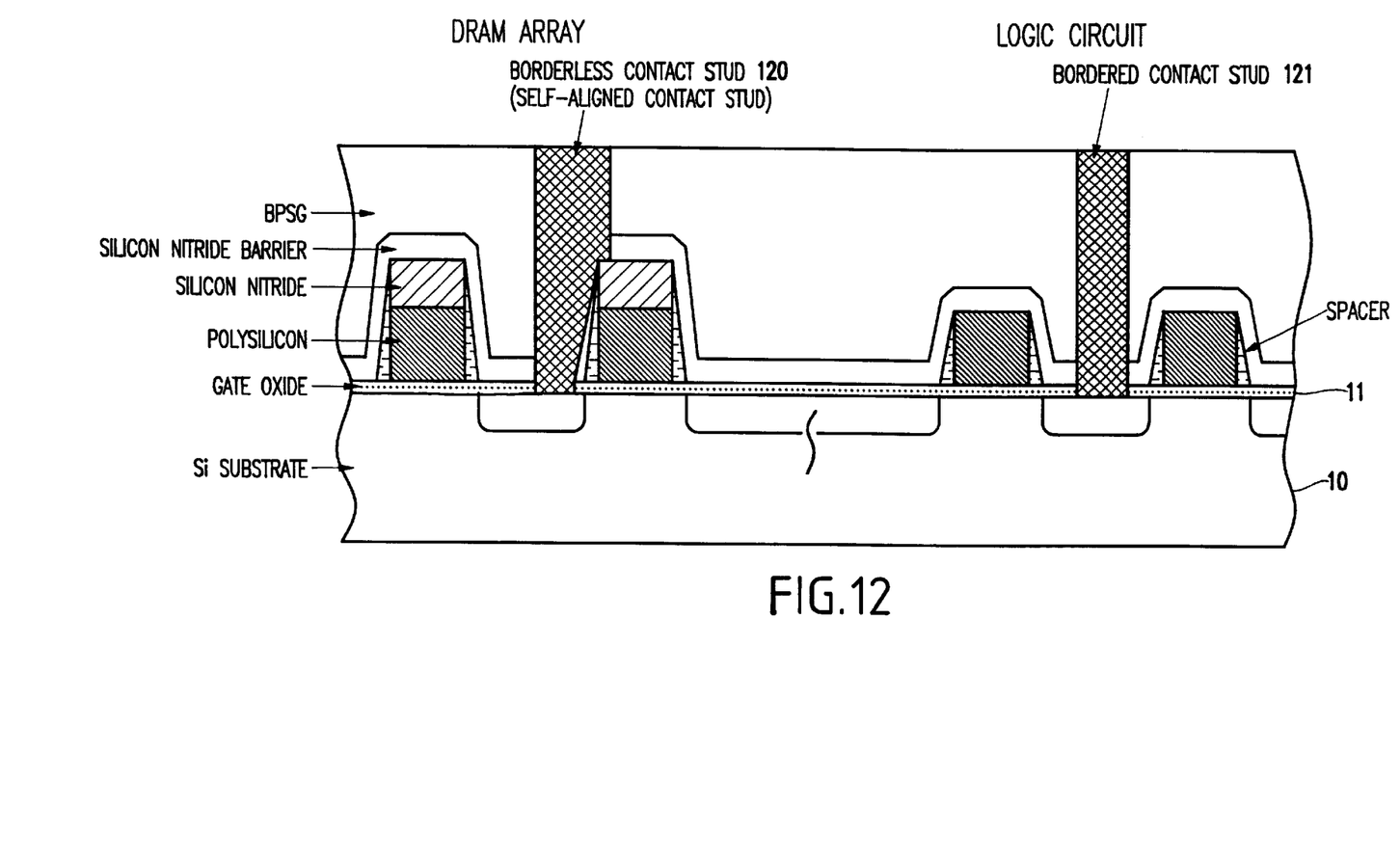
FIG. 12 shows the final step of a completed eDRAM structure having an array region and logic region formed according to the method of the invention.

Finally, as shown in FIG. 12, a polysilicon or tungsten layer is deposited and polished back by CMP to be essentially planar with the BPSG layer and provide borderless contact stud 120 and bordered contact stud 121.

This integration scheme with one-step PC patterning process and one-step contact process for both bordered and borderless contacts simplifies the process, reduces overall cost, and relaxes the litho overlay requirement for the MOL process. The borderless contact etch can allow contact holes to be either partially landed on or not landed at all on the gate stack. Very tight overlay requirement generally needs high rework rate, if feasible at all, which is an additional cost.

While the invention has been described in terms of preferred embodiments, those skilled in the art will recognize that the invention can be practiced with modification within the spirit and scope of the appended claims.

What is claimed is:

1. A method of fabricating an integrated circuit chip having a first region having a first layout rule and a second region having a second layout rule, said method comprising:

using a first material to establish a first hard mask pattern in only said first region; and using a second material to establish a second hard mask pattern on top of said first hard mask pattern, said second material further establishing a third hard mask pattern in said second region, wherein said first layout rules comprise a denser layout rule than said second layout rule.

2. The method of claim 1, wherein said first region comprises a DRAM array.

3. The method of claim 2, wherein said second region comprises a logic circuit region.

4. The method of claim 1, further comprising:

initially depositing an oxide layer common to devices in both said regions.

5. A method of fabricating an integrated circuit chip having a first region having a first layout rule and a second region having a second layout rule, said method comprising:

using a first material to establish a first hard mask pattern in only said first region; and using a second material to establish a second hard mask pattern on top of said first hard mask pattern, said second material further establishing a third hard mask pattern in said second region, wherein said first material comprises silicon nitride and said second material comprises TEOS.

6. A method of fabricating an integrated circuit chip having a first region having a first layout rule and a second region having a second layout rule, said method comprising:

using a first material to establish a first hard mask pattern in only said first region; and using a second material to establish a second hard mask pattern on top of said first hard mask pattern, said second material further establishing a third hard mask pattern in said second region; and using said first mask pattern and said second mask pattern as a mask for forming a self-aligned pattern of device regions with an ion implantation process.

7. A method of fabricating an integrated circuit chip having a first region having a first layout rule and a second region having a second layout rule, said method comprising:

using a first material to establish a first hard mask pattern in only said first region; and using a second material to establish a second hard mask pattern on top of said first hard mask pattern, said second material further establishing a third hard mask pattern in said second region; and stripping away said second hard mask and said third hard mask; and subsequently depositing a barrier material on said first region and said second region.

8. The method of claim 7, wherein said barrier material comprises silicon nitride.

9. The method of claim 8, further comprising:

forming borderless contact studs in said first region and bordered contact studs in said second region.

10. A method of fabricating eDRAM on an integrated circuit chip, comprising:

using a first material to establish a first hard mask pattern only in a first region to contain a DRAM array; and using a second material to establish a second hard mask pattern on top of said first hard mask pattern, said second material further establishing a third hard mask pattern in a second region, wherein said first material comprises silicon nitride and said second material comprises TEOS.

11. The method of claim 10, further comprising:

initially depositing an oxide layer common to devices in both said regions.

12. A method of fabricating eDRAM on an integrated circuit chip, comprising:

using a first material to establish a first hard mask pattern only in a first region to contain a DRAM array; and using a second material to establish a second hard mask pattern on top of said first hard mask pattern, said second material further establishing a third hard mask pattern in a second region; and stripping away said second hard mask and said third hard mask; and subsequently depositing a barrier material on said first region and said second region.

13. The method of claim 12, wherein said barrier material comprises silicon nitride.

14. The method of claim 13, further comprising:

forming borderless contact studs in said first region and bordered contact studs in said second region.

15. A method of fabricating eDRAM on an integrated circuit chip, comprising:

initially depositing an oxide layer over the top surface of said chip;

using a first material to establish a first hard mask pattern only in a first region of said chip, said first region preselected to comprise a DRAM array;

using a second material to establish a second hard mask pattern on top of said first hard mask pattern, said second material further establishing a third hard mask pattern in a second region of said chip, said second region preselected to comprise control logic;

using an etch process to form gate stacks simultaneously in said first region and said second region; and forming simultaneously borderless contact studs in said first region and bordered contact studs in said second region.

16. A method of fabricating eDRAM on an integrated circuit chip, comprising:

using a first material to establish a first hard mask pattern only in a first region of said chip, said first region preselected to comprise a DRAM array;

using a second material to establish a second hard mask pattern on top of said first hard mask pattern, said second material further establishing a third hard mask pattern in a second region of said chip, said second region preselected to comprise control logic; and forming simultaneously borderless contact studs in said first region and bordered contact studs in said second region.

17. A method of fabricating an integrated circuit chip having a first region having a first set of devices with a first layout rule and a second region having a second set of devices with a second layout rule, said method comprising:

forming a dual hard mask in said first region; and simultaneously forming said first set of devices and said second set of devices.

* * * * *